United States Patent
Nakamura et al.

(10) Patent No.: US 9,773,947 B2
(45) Date of Patent: Sep. 26, 2017

(54) LIGHT-EMITTING DEVICE AND PRODUCTION METHOD THEREFOR

(71) Applicant: TOYODA GOSEI CO., LTD., Kiyosu-shi (JP)

(72) Inventors: Ryo Nakamura, Kiyosu (JP); Misato Boyama, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/063,246

(22) Filed: Mar. 7, 2016

(65) Prior Publication Data

US 2016/0276537 A1    Sep. 22, 2016

(30) Foreign Application Priority Data

Mar. 19, 2015   (JP) ................. 2015-056146

(51) Int. Cl.
| | |
|---|---|
| *H01L 33/00* | (2010.01) |
| *H01L 33/24* | (2010.01) |
| *H01L 33/06* | (2010.01) |
| *H01L 33/32* | (2010.01) |
| *H01L 33/02* | (2010.01) |

(52) U.S. Cl.
CPC .............. *H01L 33/24* (2013.01); *H01L 33/02* (2013.01); *H01L 33/06* (2013.01); *H01L 33/32* (2013.01)

(58) Field of Classification Search
CPC ......... H01L 33/12; H01L 33/20; H01L 33/24; H01L 33/0025; H01L 33/0062; H01L 33/0066; H01L 33/0075; H01L 33/04; H01L 33/06
See application file for complete search history.

(56) References Cited

U.S. PATENT DOCUMENTS

| | | | |
|---|---|---|---|
| 2012/0205618 A1* | 8/2012 | Nakamura | H01L 33/24 257/13 |
| 2013/0161586 A1* | 6/2013 | Okuno | H01L 33/12 257/13 |

FOREIGN PATENT DOCUMENTS

| | | |
|---|---|---|
| JP | 3433038 B2 | 8/2003 |
| JP | 2014-110396 A | 6/2014 |

* cited by examiner

*Primary Examiner* — Charles Garber
*Assistant Examiner* — Syed Gheyas
(74) *Attorney, Agent, or Firm* — McGinn IP Law Group, PLLC

(57) ABSTRACT

An emission efficiency of a light-emitting device is improved by reducing strains applied to a light-emitting layer. On a sapphire substrate, an n-type contact layer, an nESD layer, an n-type cladding layer, a light-emitting layer, a p-type cladding layer, and a p-type contact layer, are sequentially deposited. The light-emitting layer has a MQW structure in which a layer unit of a well layer, a capping layer, and a barrier layer sequentially deposited is repeatedly deposited. Of the well layers, the In composition ratio of only first well layer is reduced than the In composition ratios of other well layers, and the In composition ratios of the other well layers are equal to each other. The In composition ratio of the first well layer is designed so that the emission wavelength of the first well layer is equal to the emission wavelengths of other well layers.

15 Claims, 3 Drawing Sheets

LIGHT-EMITTING DEVICE AND PRODUCTION METHOD THEREFOR

BACKGROUND OF THE INVENTION

Field of the Invention

The present invention relates to a Group III nitride semiconductor light-emitting device, more specifically, the one characterized by the structure of a light-emitting layer.

Background Art

In the Group III nitride semiconductor light-emitting device, a MQW structure in which a well layer and a barrier layer are repeatedly deposited is widely used as a light-emitting layer. The well layers are formed of InGaN and have the same In composition ratio.

Japanese Patent No. 3433038 describes that the In composition ratios of a well layer closest to an n-type cladding layer and a well layer closest to a p-type cladding layer are reduced than the In composition ratio of a well layer at the center, thereby relaxing the strain applied from both the n-type cladding layer and the p-type cladding layer to a light-emitting layer.

Japanese Patent Application Laid-Open (kokai) No. 2014-110396 describes that an nESD layer (n-side electrostatic breakdown preventing layer) is formed between an n-type contact layer and an n-type cladding layer, thereby generating pits in the nESD layer. The pits pass through the well layer and reach a surface of the p-type contact layer. Generation of such pits relaxes the strain in a light-emitting layer, thereby improving the emission efficiency.

However, in the method described in Japanese Patent No. 3433038, the In concentrations of the well layers closest to the n-type cladding layer and the p-type cladding layer respectively are reduced. These well layers cannot emit light, and the emission efficiency might be reduced.

Although the strain can be reduced by generating pits as described in Japanese Patent Application Laid-Open (kokai) No. 2014-110396, the strain is not sufficiently eliminated, and further strain relaxation was required.

SUMMARY OF THE INVENTION

In view of the foregoing, an object of the present invention is to provide a Group III nitride semiconductor light-emitting device in which the strain applied to a light-emitting layer is reduced, thereby improving the emission efficiency.

As a result of intensive research and development for strain reduction, the inventors found that an emission wavelength of only first well layer from an n-type cladding layer of well layers in the MQW structure was shifted to longer wavelength than emission wavelengths of other well layers. A shift of emission wavelength is caused by crystal strain. That is, it was found that the first well layer from the n-type layer of the well layers in the MQW structure is mostly affected by the strain. The present invention was made based on this finding.

In one aspect of the present invention, there is provided a Group III nitride semiconductor light-emitting device comprising an n-type contact layer, an electrostatic breakdown preventing layer, an n-type cladding layer, and a light-emitting layer sequentially deposited on a sapphire substrate, the light-emitting layer having a MQW structure in which an InGaN well layer and a barrier layer are repeatedly deposited, and having pits which extend from the electrostatic breakdown preventing layer to the light-emitting layer and pass through the light-emitting layer, wherein an In composition ratio of only first well layer from the n-type cladding layer of the well layers, is reduced than In composition ratios of other well layers other than the first well layer so that an emission wavelength of the first well layer is equal to emission wavelengths of the other well layers, the first well layer being nearest to the n-type cladding layer among all of the well layers; and all the In composition ratios of the other well layers are equal to each other.

In the other aspect of the present invention, there is provided a Group III nitride semiconductor light-emitting device comprising an n-type contact layer, an electrostatic breakdown preventing layer, an n-type cladding layer, and a light-emitting layer sequentially deposited on a sapphire substrate, the light-emitting layer having a MQW structure in which a well layer made of Group III nitride semiconductor containing In and a barrier layer made of Group III nitride semiconductor having a bandgap larger than that of the well layer are repeatedly deposited, and having pits which extend from the electrostatic breakdown preventing layer to the light-emitting layer and pass through the light-emitting layer, wherein an In composition ratio of only first well layer from the n-type cladding layer of the well layers is reduced than In composition ratios of other well layers other than the first well layer, the first well layer being nearest to the n-type cladding layer among all of the well layers; all the In composition ratios of the other well layers are equal to each other; and a difference between the In composition ratios of the other well layers and the In composition ratio of the first well layer is more than 0 at % and less than 5.2 at %.

The emission efficiency can be improved and the full width at half maximum of emission spectrum can be reduced by reducing the In composition ratio of the first well layer than the In composition ratios of the other well layers so that the emission wavelengths of the other well layers are equal to the emission wavelength of the first well layer. Equal emission wavelength may be a level that the emission wavelengths cannot be substantially distinguished from each other, for example, the absolute value of the emission wavelength difference is 2 nm or less.

Moreover, a difference between the In composition ratios of the other well layers and the In composition ratio of the first well layer is, preferably, more than 0% and less than 5.2%. Within this range, the emission efficiency can be further improved. The difference is, more preferably, 1% to 4.5%, and, further preferably, 2% to 3.5%.

The full width at half maximum of emission spectrum can be reduced by reducing the In composition ratio of the first well layer than the In composition ratios of the other well layers. For example, a light-emitting device having a half-value width of 20 nm or less can be achieved.

According to the present invention, the emission efficiency can be improved by reducing the strain applied to the first well layer without losing a light-emitting function of the first well layer.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 4 is a graphs showing the relationship between the In composition ratio difference and the emission wavelength difference of a first well layer 140a.

DETAILED DESCRIPTION OF PREFERRED EMBODIMENTS

A specific embodiment of the present invention will next be described with reference to the drawings. However, the present invention is not limited to the embodiment.

Embodiment 1

Structure of Light-Emitting Device

Figure 1:
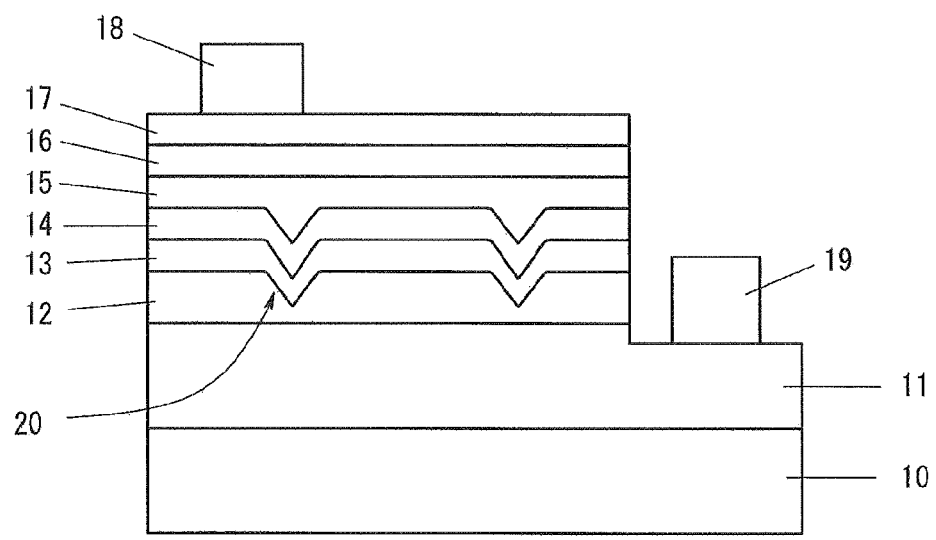
FIG. 1 is a sketch showing the structure of a light-emitting device according to Embodiment 1.

FIG. 1 is a sketch showing the structure of a Group III nitride semiconductor light-emitting device according to Embodiment 1. As shown in FIG. 1, the light-emitting device according to Embodiment 1 has a substrate 10. On the substrate 10, an n-type contact layer 11, an nESD layer 12, an n-type cladding layer 13, a light-emitting layer 14, a p-type cladding layer 15, and a p-type contact layer 16, each of them being made of Group III nitride semiconductor, are deposited via an AlN buffer layer (not illustrated). On the p-type contact layer 16, a transparent electrode 17 is provided, and on the transparent electrode 17, a p-electrode 18 is provided. A trench is formed on a part of a surface of the p-type contact layer 16, and the n-type contact layer 11 is exposed at the bottom surface of the trench. An n-electrode 19 is provided on the exposed n-type contact layer 11.

Next will be described the components of the light-emitting device according to Embodiment 1.

The substrate 10 is a sapphire substrate having a c-plane main surface. The surface on which Group III nitride semiconductor is crystal grown is roughened with concaves and convexes (not illustrated), thereby improving the emission efficiency.

The n-type contact layer 11 is disposed on the substrate 10 and is formed of n-GaN having a thickness of 6 μm and a Si concentration of $1 \times 10^{18}/cm^3$ or more. To make better Ohmic contact with the n-electrode 19, the n-type contact layer 11 may have a plurality of layers having different Si concentrations.

The nESD layer 12 is disposed on the n-type contact layer 11, and is a layer for preventing the electrostatic breakdown of the device, and is formed of, for example, n-GaN having a thickness of 850 nm grown at a temperature lower than that of the n-type contact layer 11. Pyramidal pits 20 due to threading dislocation are generated from the nESD layer 12. The pits 20 extend toward the light-emitting layer 14, pass through the light-emitting layer 14, and reach the p-type cladding layer 15. The pits 20 are gradually filled as the layers are deposited, and completely embedded by the p-type cladding layer 15 so that the p-type contact layer 16 is flat. Generation of such pits 20 relaxes the strain in the light-emitting layer 14, thereby improving the emission efficiency. The strain in the light-emitting layer 14 is caused by lattice mismatch between the light-emitting layer 14 and the lower layers (on the substrate 10).

Each of the pits 20 has a diameter of 50 nm to 170 nm on the surface of the n-type cladding layer 13 (the surface on the light-emitting layer 14 side). When the diameter of each pit 20 is 50 nm or more, the strain applied to the light-emitting layer 14 can be reduced. When the diameter of each pit 20 is more than 170 nm, effective light emission area is reduced, and the light output is reduced. The generation of pits 20 or the diameter of each pit 20 can be controlled by the growth conditions of the nESD layer 12. The diameter of each pit 20 is, more preferably, 70 nm to 150 nm, and, further preferably, 100 nm to 150 nm. The density of the pits 20 on the surface of the n-type cladding layer 13 is $1 \times 10^8/cm^2$ to $1 \times 10^9/cm^2$. When the pit density is $1 \times 10^8/cm^2$ or more, the strain applied to the light-emitting layer 14 can be reduced. When the pit density is $1 \times 10^9/cm^2$ or more, the effective light emission area is reduced, and the light output is reduced. The density of the pits 20 is, more preferably, $1 \times 10^8/cm^2$ to $7 \times 10^8/cm^2$, and, further preferably, $1 \times 10^8/cm^2$ to $5 \times 10^8/cm^2$.

The nESD layer 12 may have a plurality of layers to further improve the electrostatic breakdown voltage. For example, i-GaN and n-GaN may be sequentially deposited on the n-type contact layer 11.

The n-type cladding layer 13 is disposed on the nESD layer 12, and has an n-type superlattice structure in which a layer unit of an InGaN layer having a thickness of 2.5 nm and an In composition ratio of 8 at % (hereinafter, atomic percent (at %) is simply referred to as %), an undoped GaN layer having a thickness of 0.8 nm, and an n-GaN layer having a thickness of 1.6 nm sequentially deposited, is repeatedly deposited fifteen times. The n-type cladding layer 13 is a layer for relaxing the strain applied to the light-emitting layer 14 (due to lattice mismatch between the substrate 10 and the Group III nitride semiconductor).

Figure 2:
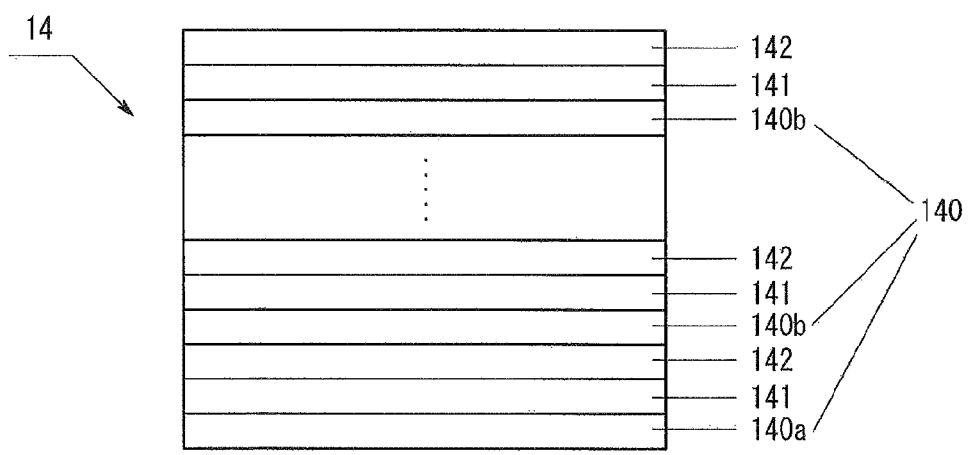
FIG. 2 is a sketch showing the structure of a light-emitting layer 14.

The light-emitting layer 14 is disposed on the n-type cladding layer 13. As shown in FIG. 2, the light-emitting layer 14 has a MQW structure in which a layer unit of a well layer 140, a capping layer 141, and a barrier layer 142 sequentially deposited is repeatedly deposited nine times.

In Embodiment 1, the number of repetitions is nine when the light-emitting layer 14 is formed by repeatedly depositing a layer unit, but it is not limited to this. However, the number of repetitions is, preferably 5 to 20, and, more preferably, 5 to 15 to improve the emission efficiency. To sufficiently achieve the strain reduction effect by the pits 20 in the light-emitting layer 14, the total thickness of the light-emitting layer 14 is, preferably, 500 nm to 700 nm.

The well layer 140 is formed of InGaN having a thickness of 3.5 nm. The In composition ratio of the well layer 140 will be described later. The capping layer 141 has a structure in which GaN having a thickness of 0.8 nm, AlGaN having a thickness of 0.8 nm and an Al composition ratio of 15% are sequentially deposited on the well layer 140. The capping layer 141 is a layer for preventing In evaporation from the well layer 140 when the temperature rises to form a barrier layer 142 after the formation of the well layer 140. The barrier layer 142 is formed of AlGaN having a thickness of 2.5 nm and an Al composition ratio of 6%. However, only the ninth barrier layer 142 from the n-type cladding layer 13 (i.e. the layer adjacent to the p-type cladding layer 15) is formed of GaN instead of AlGaN to facilitate hole injection into the light-emitting layer 14.

The material of the well layer 140 is not limited to InGaN as long as it is Group III nitride semiconductor containing In. The barrier layer 142 may be formed of Group III nitride semiconductor having a band gap larger than that of the well layer 140. The capping layer 141 is not necessarily required.

It is preferably provided to improve the emission efficiency. In Embodiment 1, the capping layer 141 has a plurality of layers. However, any conventional structure, for example, a single layer of GaN, AlGaN, or AlGaInN may be used.

The p-type cladding layer 15 is disposed on the light-emitting layer 14, and has a superlattice structure in which a layer unit of a p-InGaN layer having a thickness of 0.8 nm and an In composition ratio of 5%, a p-AlGaN layer having a thickness of 1.5 nm and an Al composition ratio of 30% sequentially deposited is repeatedly deposited twelve times.

The p-type contact layer 16 is disposed on the p-type cladding layer 15, and is formed of p-GaN having a thickness of 70 nm and a Mg concentration of $1\times10^{19}/cm^3$ to $1\times10^{22}/cm^3$. To make a good Ohmic contact between the transparent electrode 17 and the p-type contact layer 16, the p-type contact layer 16 may have a plurality of layers having different composition ratios or Mg concentrations.

The transparent electrode 17 is formed of ITO so as to cover almost the entire surface of the p-type contact layer 16. Other than ITO, IZO (Zinc-doped Indium oxide) or ICO (Indium Cerium Oxide) may be used.

The p-electrode 18 is disposed on the transparent electrode 17 and makes an Ohmic contact with the transparent electrode 17. The n-electrode 19 is disposed on the n-type contact layer 11 exposed at the bottom surface of the trench, and makes an Ohmic contact with the n-type contact layer 11.

[In Composition Ratio of the Well Layer]

Next will be described in detail the In composition ratio of the well layer 140 in the light-emitting layer 14. Firstly, to facilitate the description, the first well layer from the n-type cladding layer 13 is referred to as first well layer 140a, and each of the well layers 140 other than the first well layer 140a (the second to ninth well layers from the n-type cladding layer 13) is referred to as other well layer 140b. The In composition ratio of each well layer 140 is respectively 19.4% for the first well layer 140a and 22% for the other well layers 140b.

Of the well layers 140, the In composition ratio of only the first well layer 140a is reduced than the In composition ratios of the other well layers 140b, and the In composition ratios of the other well layers 140b are equal to each other. Equal In composition ratios may be a level that the In composition ratios cannot be substantially distinguished from each other. If the growth conditions for forming other well layers 140b (growth temperature or In source gas supply amount) are the same, the In composition ratios of the other well layers 140b may be considered as the same. When the first well layer 140a has such an In composition ratio, the strain applied to the light-emitting layer 14 (due to lattice mismatch between the light-emitting layer 14 and the lower layers) can be reduced, thereby improving the emission efficiency.

The In composition ratio of each well layer 140 can be controlled by the growth conditions such as growth temperature and In source gas supply amount.

Moreover, the In composition ratio of the first well layer 140a is set so that the emission wavelength of the first well layer 140a is equal to the emission wavelengths of the other well layers 140b. Equal emission wavelengths may be a level that the emission wavelengths cannot be substantially distinguished from each other, for example, the absolute value of the emission wavelength difference is 2 nm or less. Since the effective bandgap becomes large due to strain reduction in the first well layer 140a and reduction in the In composition ratio of the first well layer 140a, the emission wavelength of the first well layer 140a is shifted to shorter wavelength. However, the emission wavelength of the first well layer 140a can be made equal to the emission wavelengths of the other well layers 140b by appropriately selecting the reduction range of the In composition ratio. By designing the first well layer 140a so as to have such an In composition ratio, the emission efficiency can be improved, and the full width at half maximum of emission spectrum can be narrowed. For example, a light-emitting device having a full width at half maximum of 20 nm or less can be achieved. To determine the In composition ratio of the first well layer 140a in this way, the following may be performed.

Firstly, a light-emitting device for adjusting wavelength is produced so as to have the same structure of the light-emitting device according to Embodiment 1 except for the In composition ratio of the first well layer 140a. A few types of light-emitting devices for adjusting wavelength are produced, with varying the In composition ratio of the first well layer 140a as a parameter. The relationship between the In composition ratio and the emission wavelength of the first well layer 140a is obtained. This relationship is linearly approximated, and its inclination (change rate of the emission wavelength against the In composition ratio) is obtained. Then, it is estimated from the change rate of the emission wavelength against the In composition ratio and the emission wavelength difference, how much the In composition ratio of the first well layer 140a should be reduced to make the emission wavelength of the first well layer 140a equal to the emission wavelengths of the other well layers 140b. A light-emitting device can be designed so that the emission wavelength of the first well layer 140a is equal to the emission wavelengths of the other well layers 140b, by reducing the In composition ratio of the first well layer 140a by the estimated value from the In composition ratios of the other well layers 140b.

The emission wavelength of the first well layer 140a may not be equal to the emission wavelengths of the other well layers 140b. However, a difference between the In composition ratio of the first well layer 140a and the In composition ratios of the other well layers 140b is, preferably, more than 0% and less than 5.2%. Within this range, the emission efficiency can be improved. The difference is, more preferably, 1% to 4.5%, and, further preferably, 2% to 3.5%.

The reason for setting the In composition ratio of each well layer 140 in this way will be described below.

Since the lattice constant of sapphire is different from that of Group III nitride semiconductor, strain is generated in the Group III nitride semiconductor layers (layers from the n-type contact layer 11 to the p-type contact layer 16) deposited on the substrate 10. Particularly, the strain in the light-emitting layer 14 causes a problem such as reduction in the emission efficiency due to degradation of crystal quality.

To improve the emission efficiency by eliminating the strain in the light-emitting layer 14, the strain is reduced by generating pits 20 in the nESD layer 12. However, there is still room for reducing the strain, and further strain relaxation was required.

The inventors found from various studies for strain elimination that when all the In composition ratios of the well layers 140 are equal, only the emission wavelength of the first well layer 140a of the well layers 140 was shifted to longer wavelength than the emission wavelengths of the other well layers 140b. A shift of emission wavelength is considered to be caused by the effective band gap reduction due to the strain in the first well layer 140a. The first well layer 140a is considered to be more largely strained than the other well layers 140b. This is because there is a lattice mismatch between the first well layer 140a made of InGaN and the lower layers, and the strain due to lattice mismatch is considered to be almost relaxed in the first well layer 140a.

Figure 3:
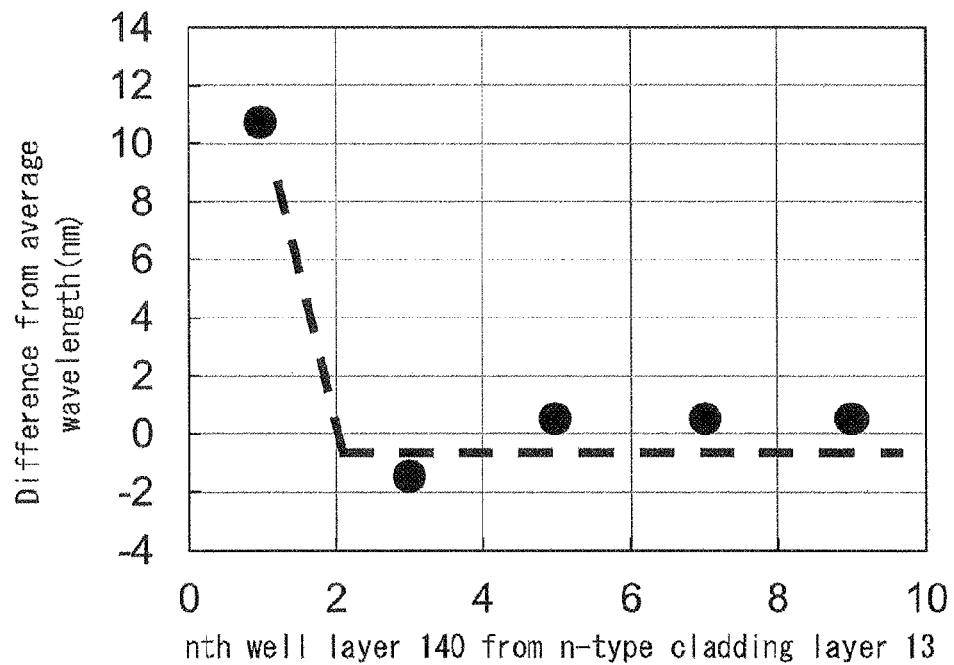
FIG. 3 is a graph showing the emission wavelengths of well layers 140.

FIG. 3 is a graph showing the emission wavelengths of the respective well layers 140 in the light-emitting device produced as a Comparative Example. The Comparative Example is the light-emitting device in which all the In composition ratios of the well layers 140 are all equal 22% and other structure is the same as that of the light-emitting device according to Embodiment 1. The numbers on the horizontal axis indicate the nth well layer from the n-type cladding layer 13. The vertical axis indicates the differences (unit: nm) from the average emission wavelength of the other well layers 140b (the second to ninth well layers 140 from the n-type cladding layer 13). As is clear from FIG. 3, only the emission wavelength of the first well layer 140a from the n-type cladding layer 13 is largely shifted by 10.5 nm to longer wavelength than that of the other well layers 140b.

It was found from this result that by reducing the In composition ratio of only the first well layer 140a without changing the In composition ratios of the other well layers 140b, the lattice constant of the first well layer 140a is made closer to that of the GaN layer of the n-type cladding layer 13 which is adjacent to the first well layer 140a, thereby the strain can be reduced. Moreover, it was also found that since the effective bandgap of the first well layer 140a becomes large due to strain reduction in the first well layer 140a and reduction in the In composition ratio of the first well layer 140a, the emission wavelength of the first well layer 140a is shifted to shorter wavelength, thereby the emission wavelength of the first well layer 140a can be made closer to the emission wavelengths of the other well layers 140b, and the full width at half maximum of emission spectrum can be reduced.

The reduction range of the In composition ratio of the first well layer 140a may be within a range that the first well layer 140a can serve as a well layer, that is, the emission efficiency is not reduced due to loss of light-emitting function. When the reduction range of the In composition ratio of the first well layer 140a is selected so that the emission wavelength of the first well layer 140a is equal to the emission wavelengths of the other well layers 140b, the emission efficiency can be improved, and the full width at half maximum of emission spectrum in the light-emitting device can be narrowed because the emission wavelengths of the respective well layers are equal. For example, the full width at half maximum can be narrowed to 20 nm or less.

Figure 4:
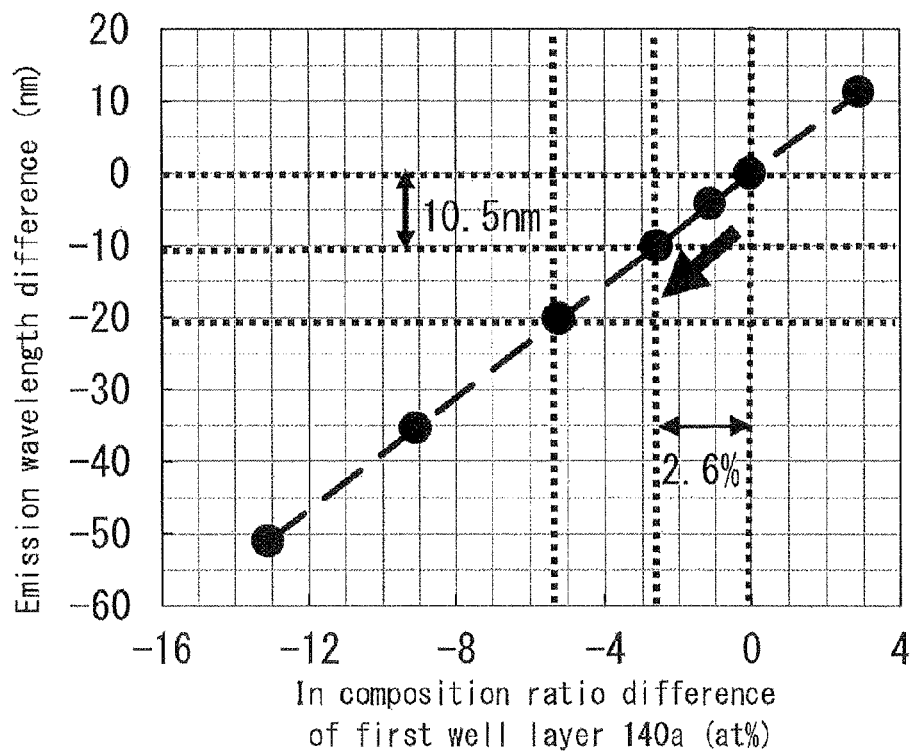

FIG. 4 is a graph showing the relationship between the In composition ratio difference and the emission wavelength difference of the first well layer 140a. The horizontal axis indicates the differences between the In composition ratio of the first well layer 140a and the In composition ratio of the other well layers 140b (the average value of the other well layers 140b, 22%). The vertical axis indicates the differences between the emission wavelength of the first well layer 140a and the reference wavelength. At this time, the reference wavelength is the emission wavelength of the first well layer 140a when the In composition ratio difference is 0 (the In composition ratio of the first well layer 140a is equal to the In composition ratio of the other well layers 140b).

As shown in FIG. 4, the emission wavelength almost linearly changes with respect to variation in the In composition ratio of the first well layer 140a. The In composition ratio when the emission wavelength of the first well layer 140a is equal to the emission wavelengths of the other well layers 140b can be estimated by obtaining the inclination of this straight line (change rate of the emission wavelength against the In composition ratio). As shown in FIG. 3, when the In composition ratio of the first well layer 140a is equal (22%) to the In composition ratios of the other well layers 140b, the emission wavelength of the first well layer 140a was shifted by 10.5 nm to longer wavelength than the emission wavelengths of the other well layers 140b. As is clear from FIG. 4, when the value of the vertical axis is −10.5 nm, the In composition ratio difference is −2.6%. The emission wavelength of the first well layer 140a can be made equal to the emission wavelengths of the other well layers 140b. In other words, the In composition ratio of the first well layer 140a may be 19.4%.

Figure 5:
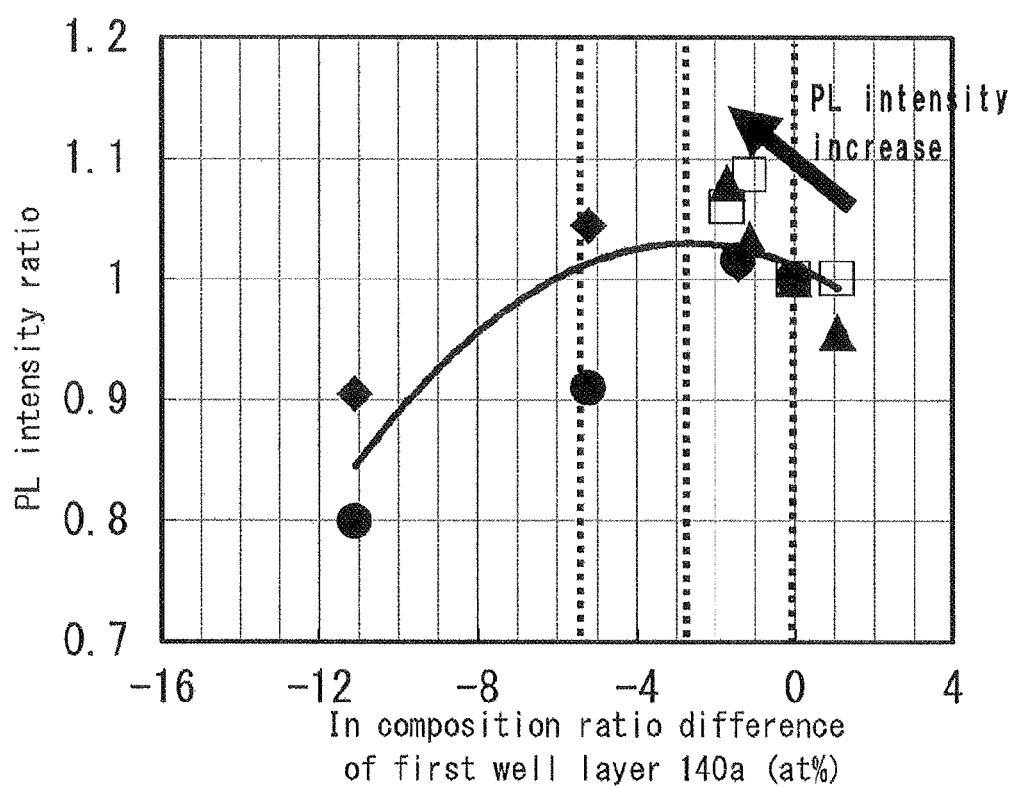
FIG. 5 is a graph showing the relationship between the In composition ratio difference of the first well layer 140a and the PL intensity ratio.

FIG. 5 is a graph showing the relationship between the In composition ratio difference of the first well layer 140a and the PL intensity ratio. The horizontal axis is the same as FIG. 4. The vertical axis indicates a ratio of the PL intensity to the PL intensity when the In composition ratio difference of the first well layer 140a is 0 (the In composition ratio of the first well layer 140a is equal to the In composition ratio of the other well layers 140b).

As shown in FIG. 5, when the In composition ratio of the first well layer 140a is gradually reduced, the PL intensity is gradually increased. After the PL intensity reaches a peak at the In composition ratio difference of −2.6%, it turned to decrease. When the In composition ratio difference is −5.2%, the PL intensity was almost equal to that when the In composition ratio difference is 0. It was found from this result that the reduction range may be more than 0% and less than 5.2% to improve the emission efficiency by reducing the In composition ratio of the first well layer 140a. As is clear from FIG. 5, the reduction range of the In composition ratio of the first well layer 140a may be, more preferably 1% to 4.5%, and, further preferably, 2% to 3.5% to further improve the emission efficiency.

As mentioned above, in the light-emitting device according to Embodiment 1, the well layer 140 of the light-emitting layer 14 having a MQW structure is designed so that the In composition ratio of the first well layer 140a is reduced than the In composition ratios of the other well layers 140b, and all the In composition ratios of the other well layers 140b are equal to each other. This can reduce the strain in the first well layer 140a, and compensate the emission wavelength by making the emission wavelength of the first well layer 140a closer to the emission wavelengths of the other well layers 140b. As a result, the light-emitting device according to Embodiment 1 exhibits higher emission efficiency than the conventional one.

Variations

The structure of the light-emitting device is not limited to the one described in Embodiment 1. Any structure may be used as long as an n-type contact layer, an nESD layer, an n-type cladding layer, and a light-emitting layer are sequentially deposited on a sapphire substrate, each of them being formed of Group III nitride semiconductor. The present invention may be applied to any type of light-emitting device such as a face-up type or a flip-chip type.

The structure of the light-emitting layer is not limited to the structure shown in Embodiment 1. Any structure may be used as long as the light-emitting layer has a MQW structure in which at least a well layer made of Group III nitride semiconductor containing In and a barrier layer made of Group III nitride semiconductor having a bandgap larger than that of the well layer are deposited.

The light-emitting device of the present invention can be employed as a light source of a display apparatus or an illumination apparatus.

What is claimed is:

1. A Group III nitride semiconductor light-emitting device comprising:
   an n-type contact layer;
   an electrostatic breakdown preventing layer;
   an n-type cladding layer with an n-type superlattice structure in which a layer unit comprising an InGaN layer not emitting a light and GaN layer sequentially deposited on the electrostatic breakdown preventing layer; and
   a light-emitting layer with a MQW structure in which a well layer consisting of InGaN emitting a light, a capping layer comprising a GaN layer and an AlGaN layer and a barrier layer comprising AlGaN are repeatedly deposited on the n-type cladding layer, and having pits which extend from the electrostatic breakdown preventing layer to the light-emitting layer and pass through the light-emitting layer, wherein:
   an In composition ratio of only first well layer is reduced than In composition ratios of other well layers other than the first well layer so that an emission wavelength of the first well layer is equal to emission wavelengths of the other well layers, the first well layer being nearest to the n-type cladding layer among all of the well layers,
   all the In composition ratios of the other well layers are equal to each other, and
   the In composition ratio of the first well layer is larger than an In composition ratio of the InGaN layer of the n-type cladding layer.

2. The Group III nitride semiconductor light-emitting device according to claim 1, wherein a difference between the In composition ratios of the other well layers and the In composition ratio of the first well layer is more than 0 at % and less than 5.2 at %.

3. The Group III nitride semiconductor light-emitting device according to claim 1, wherein a difference between the In composition ratios of the other well layers and the In composition ratio of the first well layer is 1 at % to 4.5 at %.

4. The Group III nitride semiconductor light-emitting device according to claim 1, wherein a difference between the In composition ratios of the other well layers and the In composition ratio of the first well layer is 2 at % to 3.5 at %.

5. The Group III nitride semiconductor light-emitting device according to claim 1, wherein a diameter of the pits is 50 nm to 170 nm on the surface of the n-type cladding layer of the light-emitting layer side.

6. The Group III nitride semiconductor light-emitting device according to claim 1, wherein a density of the pits is $1 \times 10^8/cm^2$ to $1 \times 10^9/cm^2$ on the surface of the n-type cladding layer of the light-emitting layer side.

7. The Group III nitride semiconductor light-emitting device according to claim 1, wherein a thickness of the first well layer is larger than a thickness of the InGaN layer of the n-type cladding layer.

8. The Group III nitride semiconductor light-emitting device according to claim 1, wherein an In composition ratio of the InGaN layer in each of the layer unit in the n-type cladding layer is same.

9. A Group III nitride semiconductor light-emitting device comprising:
   an n-type contact layer;
   an electrostatic breakdown preventing layer;
   an n-type cladding layer with an n-type superlattice structure in which a layer unit comprising an InGaN layer not emitting a light and GaN layer sequentially deposited on the electrostatic breakdown preventing layer; and
   a light-emitting layer with a MQW structure in which a well layer consisting of InGaN emitting a light, a capping layer comprising a GaN layer and an AlGaN layer and a barrier layer comprising AlGaN are repeatedly deposited on the n-type cladding layer, and having pits which extend from the electrostatic breakdown preventing layer to the light-emitting layer and pass through the light-emitting layer, wherein:
   an In composition ratio of only first well layer is reduced than In composition ratios of other well layers other than the first well layer, the first well layer being nearest to the n-type cladding layer among all of the well layers,
   all the In composition ratios of the other well layers are equal to each other,
   the In composition ratio of the first well layer is larger than an In composition ratio of the InGaN layer of the n-type cladding layer, and
   a difference between the In composition ratios of the other well layers and the In composition ratio of the first well layer is more than 0 at % and less than 5.2 at %.

10. The Group III nitride semiconductor light-emitting device according to claim 9, wherein a difference between the In composition ratios of the other well layers and the In composition ratio of the first well layer is 1 at % to 4.5 at %.

11. The Group III nitride semiconductor light-emitting device according to claim 9, wherein a difference between the In composition ratios of the other well layers and the In composition ratio of the first well layer is 2 at % to 3.5 at %.

12. The Group III nitride semiconductor light-emitting device according to claim 9, wherein a diameter of the pits is 50 nm to 170 nm on the surface of the n-type cladding layer of the light-emitting layer side.

13. The Group III nitride semiconductor light-emitting device according to claim 9, wherein a density of the pits is $1 \times 10^8/cm^2$ to $1 \times 10^9/cm^2$ on the surface of the n-type cladding layer of the light-emitting layer side.

14. The Group III nitride semiconductor light-emitting device according to claim 9, wherein a thickness of the first well layer is larger than a thickness of the InGaN layer of the n-type cladding layer.

15. The Group III nitride semiconductor light-emitting device according to claim 9, wherein an In composition ratio of the InGaN layer in each of the layer unit in the n-type cladding layer is same.

* * * * *